US009269766B2

(12) United States Patent
Wu et al.

(10) Patent No.: US 9,269,766 B2
(45) Date of Patent: Feb. 23, 2016

(54) GUARD RING FOR MEMORY ARRAY

(71) Applicant: GLOBALFOUNDRIES Singapore Pte. Ltd., Singapore (SG)

(72) Inventors: Ling Wu, Singapore (SG); Jianbo Yang, Singapore (SG); Kian Hong Lim, Singapore (SG); Sung Mun Jung, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/490,629

(22) Filed: Sep. 18, 2014

(65) Prior Publication Data

US 2015/0084111 A1  Mar. 26, 2015

Related U.S. Application Data

(60) Provisional application No. 61/880,187, filed on Sep. 20, 2013.

(51) Int. Cl.
| H01L 27/00 | (2006.01) |
| H01L 29/06 | (2006.01) |
| H01L 27/115 | (2006.01) |
| H01L 21/28 | (2006.01) |
| H01L 21/768 | (2006.01) |
| H01L 29/423 | (2006.01) |

(52) U.S. Cl.
CPC ...... *H01L 29/0619* (2013.01); *H01L 21/28273* (2013.01); *H01L 21/76802* (2013.01); *H01L 27/11521* (2013.01); *H01L 27/11526* (2013.01); *H01L 27/11548* (2013.01); *H01L 29/42324* (2013.01)

(58) Field of Classification Search
CPC ............... H01L 29/0619; H01L 27/11548; H01L 21/28273; H01L 27/11521
USPC .......................................... 257/316
See application file for complete search history.

(56) References Cited

U.S. PATENT DOCUMENTS

| 2005/0093047 | A1* | 5/2005 | Goda et al. ............... 257/300 |
| 2005/0127473 | A1* | 6/2005 | Sakagami ................. 257/510 |
| 2008/0073696 | A1* | 3/2008 | Hazama .................... 257/316 |
| 2010/0270608 | A1* | 10/2010 | Pham et al. ............... 257/324 |
| 2011/0233714 | A1* | 9/2011 | Lu ............................ 257/493 |
| 2011/0248317 | A1* | 10/2011 | Kim et al. ................. 257/208 |
| 2012/0161231 | A1* | 6/2012 | Tamaki et al. ............ 257/335 |
| 2012/0299056 | A1* | 11/2012 | Arai et al. ................. 257/144 |
| 2013/0020624 | A1* | 1/2013 | Huang et al. ............. 257/314 |
| 2015/0087123 | A1* | 3/2015 | Wu et al. ................... 438/257 |

* cited by examiner

*Primary Examiner* — Nathan Ha
(74) *Attorney, Agent, or Firm* — Horizon IP Pte. Ltd.

(57) ABSTRACT

A device and a method for forming a device are presented. The method includes providing a substrate having an array region in which memory cells are to be formed. Storage gates of the memory cells are formed in the array region. A guard ring surrounding the array region is formed. A gate electrode layer is formed on the substrate. The gate electrode layer fills gaps between the storage gates and guard ring. The gate electrode layer is planarized to produce a planar surface between the gate electrode layer, storage gates and guard ring. The guard ring maintains thickness of the gate electrode layer in the array region such that thickness of the storage gates across center and edge regions of the array region is uniform.

20 Claims, 7 Drawing Sheets

US 9,269,766 B2

GUARD RING FOR MEMORY ARRAY

CROSS-REFERENCE TO RELATED APPLICATION

This application claims the priority benefit of U.S. Provisional Application Ser. No. 61/880,187, filed on Sep. 20, 2013, which is herein incorporated by reference in its entirety.

BACKGROUND

In integrated circuits (ICs), various devices such as logic devices and memory devices are configured to achieve the desired function. The memory devices and the logic devices surrounding the memory devices, for example, do not have substantially the same stack height across the same device. During fabrication of these devices, we have observed that the remaining gate electrode thickness which is suitable for forming, for example, the access gate or word line of the memory device is non-uniform across the edge and center regions of the memory array region. For example, we have found that a portion of the gate electrode layer at the edge of the memory array region is undesirably removed during a chemical mechanical polishing process (CMP) which is used to planarize the top surface of the gate electrode layer. The remaining gate electrode thickness at the edge of the memory array region is non-planar and includes a sloped profile relative to the remaining gate electrode thickness at the center region of the memory array region. The top surface of the remaining gate electrode layer at the edge of the memory array region, for example, is lower than that at the center region of the memory array region. This is undesirable as it may impact the yield.

From the foregoing discussion, it is desirable to have the remaining gate electrode thickness to be uniform across the different regions in an array region of the device.

SUMMARY

Embodiments generally relate to semiconductor device and method for forming a semiconductor device. In one embodiment, a method for forming a device is presented. The method includes providing a substrate having an array region in which memory cells are to be formed. Storage gates of the memory cells are formed in the array region. A guard ring surrounding the array region is formed. A gate electrode layer is formed on the substrate. The gate electrode layer fills gaps between the storage gates and guard ring. The gate electrode layer is planarized to produce a planar surface between the gate electrode layer, storage gates and guard ring. The guard ring maintains thickness of the gate electrode layer in the array region such that thickness of the storage gates across center and edge regions of the array region is uniform.

In another embodiment, a method for forming a device is disclosed. The method includes providing a substrate having an array region in which memory cells are to be formed. Storage gates of the memory cells are formed in the array region. A guard ring surrounding the array region is formed. The guard ring is a storage gate guard ring which includes same layers as the storage gates of the memory cells.

In yet another embodiment, a device is presented. The device includes a substrate having an array region in which memory cells are disposed and a plurality of storage gates of the memory cells disposed in the array region. The device also includes a guard ring which surrounds the array region. The guard ring is a storage gate guard ring which includes same layers as the storage gates of the memory cells.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1:
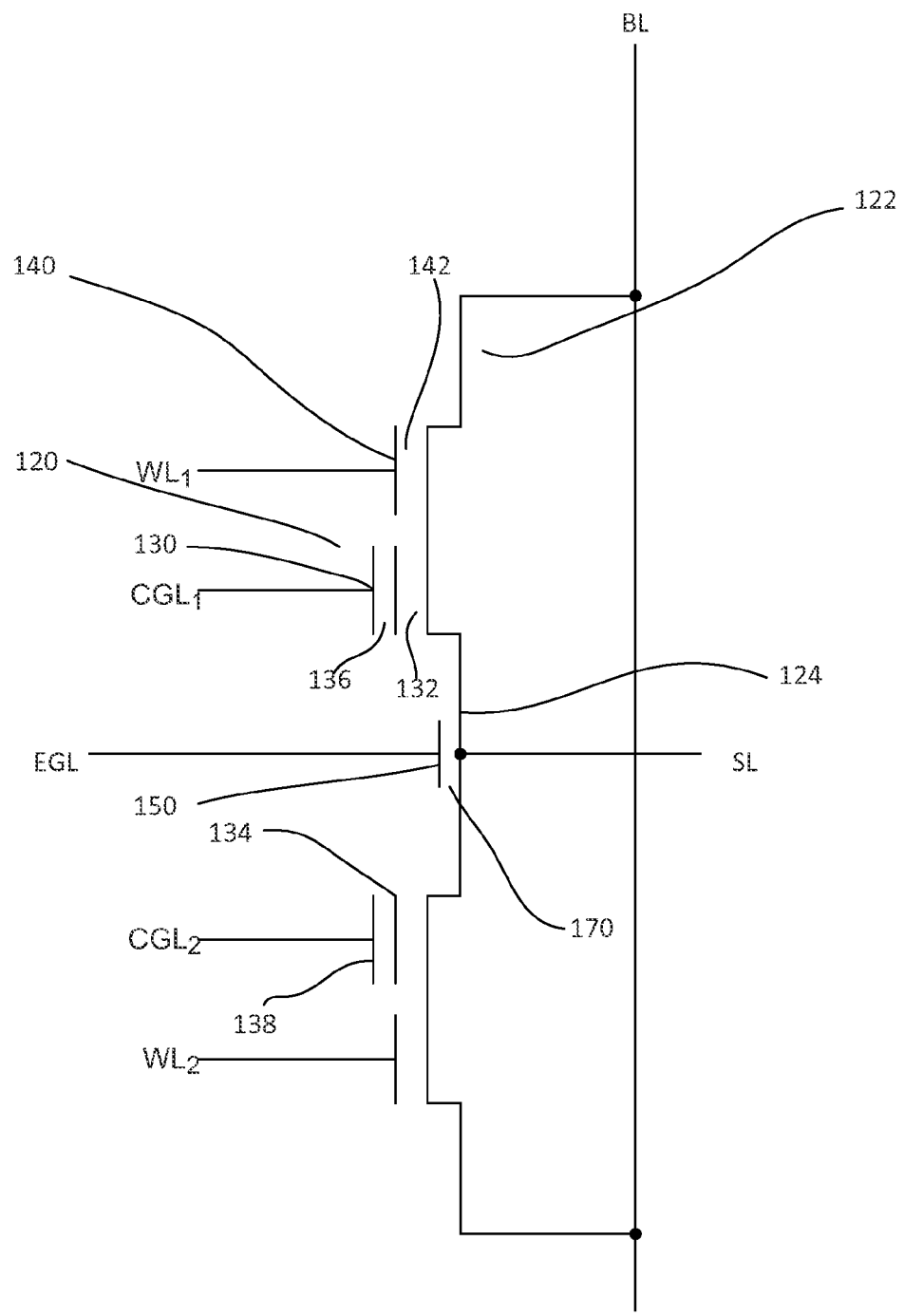
FIG. 1 shows schematic diagram of an embodiment of a device.

FIG. 1 shows a schematic diagram of an embodiment of a device with a memory cell pair 110. For example, the memory cell pair includes first and second memory cells. The memory cells, in one embodiment, are NVM cells. Providing other types memory cells may also be useful.

A memory cell includes a cell transistor with a gate 120 between terminals 122 and 124. The gate, in one embodiment, is a split gate. For example, the split gate includes primary and secondary gates 130 and 140. The primary gate may be referred to as a storage gate. The storage gate includes a control gate 138 and a floating gate 134. The floating gate is separated from a channel of the transistor by a floating gate dielectric 132 and the control gate is separated from the control gate by a storage gate dielectric 136. The control gate is coupled to a control gate line (CGL). As for the secondary gate, it serves as an access gate. For example, the secondary gate includes an access gate separated from the transistor channel by an access gate dielectric 142. The access gate is coupled to a wordline (WL).

The first terminal is coupled to a bitline (BL). As for the second terminal, it is coupled to a source line (SL). An erase gate 150 is provided over the second terminal. The erase gate is separated from the second terminal by an erase gate dielectric 170. The erase gate is coupled to an erase gate line (EGL).

As illustrated, the memory cells of the pair share a common EGL and SL. For example, the second terminals of the first and second cell transistors form a common second terminal. A first wordline ($WL_1$) is coupled to the access gate of the first cell transistor and a first control gate line ($CGL_1$) is coupled to the control gate of the first cell transistor; a second wordline ($WL_2$) is coupled to the access gate of the second cell transistor and a second control gate line ($CGL_2$) is coupled to the control gate of the second cell transistor. As for the first terminals of the cell transistors, they are coupled to a common bitline (BL). For example, the cells of the memory cell pair are part of the same column of memory cells. Memory cells may be interconnected by wordlines (WLs), control gate lines (CGLs), erase gate lines (EGLs), source lines (SLs) and bitlines (BLs) to form a memory array.

Figure 2:
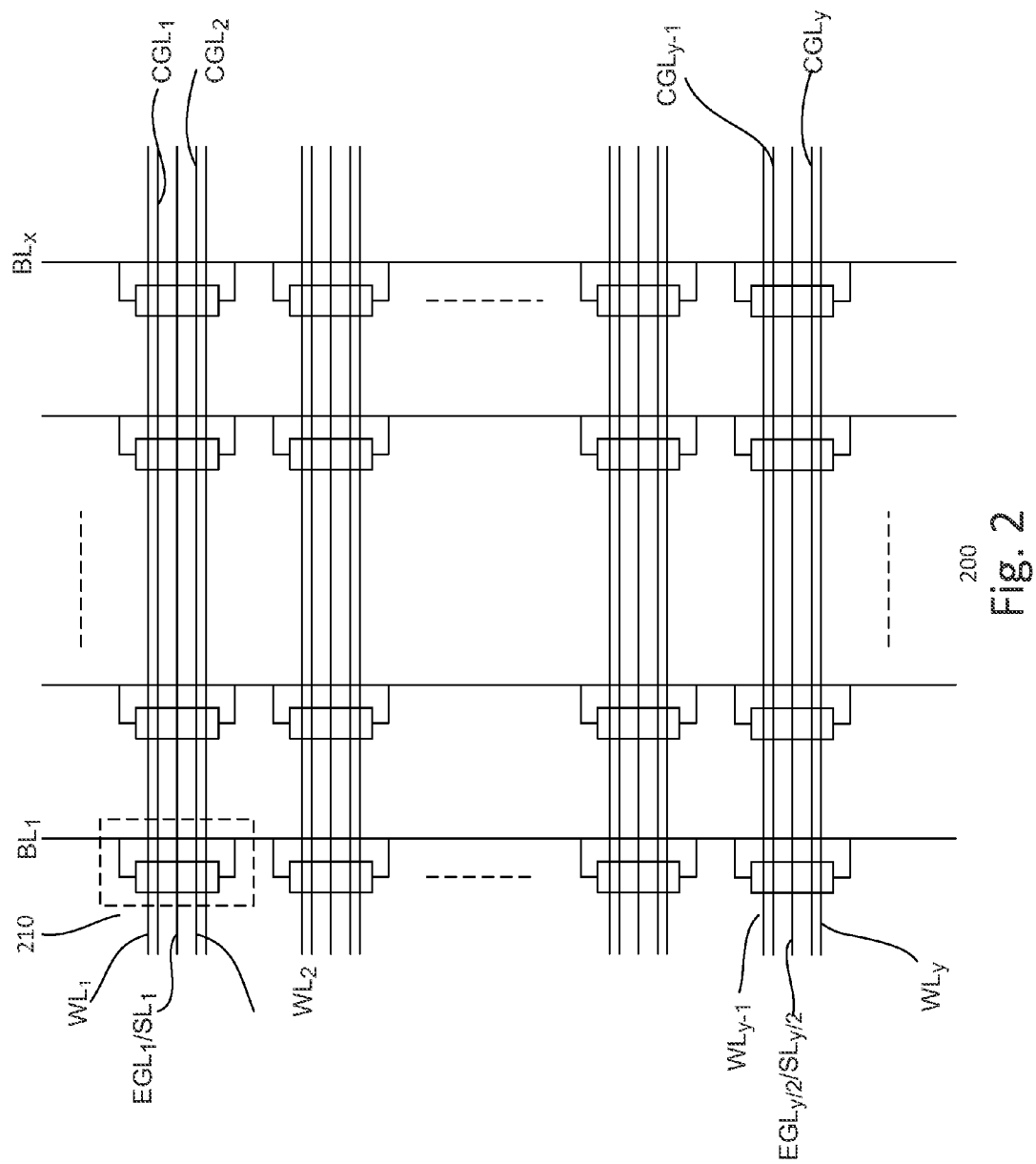
FIG. 2 shows an embodiment of a memory array.

FIG. 2 shows a plurality of memory cell pairs 210 configured to form a memory array 200. The plurality of memory cell pairs of the array are arranged in first and second directions. Memory cells are interconnected in the first direction by wordlines (WLs), control gate lines (CGLs), erase gate lines (EGLs), and source lines (SLs) to form rows of memory cells and in the second direction by bitlines (BLs) to form columns of memory cell. As shown, the array includes y rows and x columns of memory cells. Since EGLs and SLs are common to a pair of memory cells, there are y/2 EGLs and SLs.

Appropriate voltages may be applied to a memory cell via the BL, CGL, WL, EGL and SL to perform different memory operations. The different memory operations may include program, read and erase operations. Table 1 below shows exemplary biasing conditions of the memory array for selected and non-selected cells for different operations.

TABLE 1

| | Signal (V) | | | | | | | | | |
|---|---|---|---|---|---|---|---|---|---|---|
| | WL | | SL | | BL | | CGL | | EGL | |
| Operations | sel | Un-sel | Sel | Un-sel | sel | Un-sel | sel | Un-sel | sel | unsel |
| Read | $V_{CC}$ | 0 | 0 | $V_{ref}$ | $V_{ref}$ | $V_{CC}$ | 0 | 0 | 0 | 0 |
| Program | $V_t < V < V_{CC}$ | 0 | 4.5 | 0 | <1 | $V_{CC}$ | 10 | 0 | 4.5 | 0 |
| Erase | 0 | 0 | 0 | 0 | 0 | 0 | 0 | 0 | 10-12 | 0 |

The biasing conditions as shown in Table 1 are exemplary. Other suitable biasing conditions may also be useful.

Figure 3:
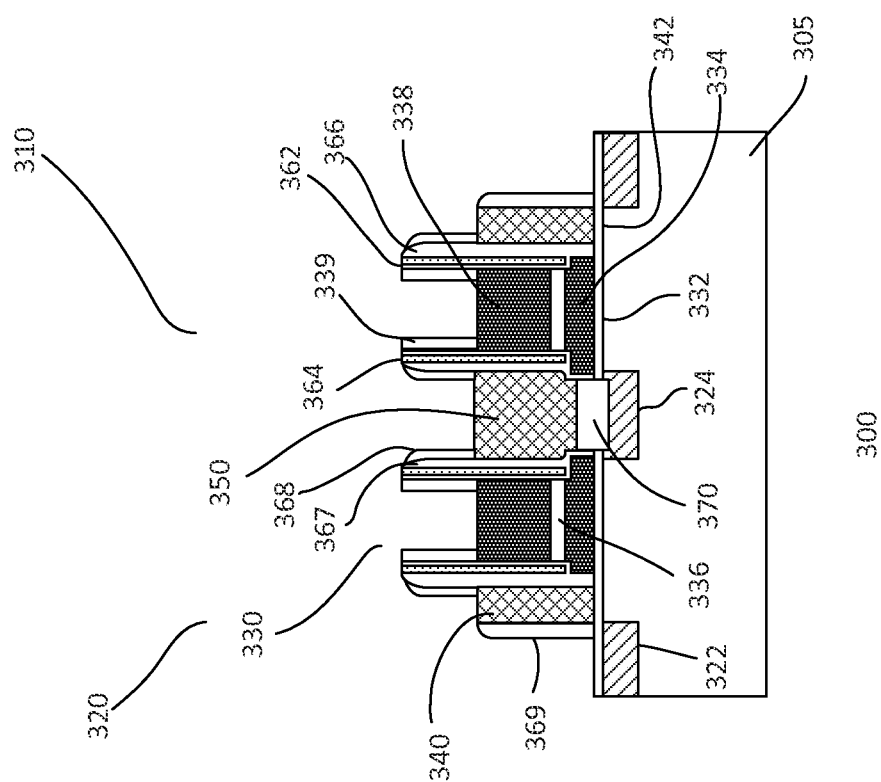
FIG. 3 shows a cross-sectional view of an embodiment of a device.

FIG. 3 shows a cross-sectional view of an embodiment of a device 300. The device includes a substrate 305. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations.

The substrate may be prepared with a memory region containing memory cells of the device. The memory region can be referred to as an array region. Providing a substrate prepared with other types of regions (not shown) may also be useful. For example, the substrate may include a logic region for support or other types of logic circuitry. The substrate may also include regions for other types of circuitry, depending on the type of device or IC. For example, the logic region may include sub-regions for high voltage (HV), medium voltage (MV) and low voltage (LV) devices.

As shown, the memory region includes a pair of memory cells 310. In one embodiment, the memory cells are NVM memory cells. Providing other types of memory cells may also be useful. The pair of memory cells may be adjacent memory cells of a column of memory cells. It is understood that the cell region includes numerous memory cells arranged in columns and rows to form a memory array. The array may be configured to have sub-arrays or sectors.

The array region may include a doped well (not shown) with dopants of a second polarity type. The doped well may be intermediately or heavily doped. Providing a doped well having other dopant concentrations may also be useful. The doped well may be a common doped well in the array region for the memory cells. In one embodiment, the array well is biased at an array well bias voltage ($V_{bias}$). In one embodiment, $V_{bias}$ is about 0V. The second polarity type doped well serves as a well for a first polarity type device. In one embodiment, the second polarity type includes p-type. For example, the p-type doped well serves as a well for a n-type memory cell. Providing a n-type doped well may also be useful. P-type dopants can include boron (B), aluminum (Al), indium (In) or a combination thereof while n-type dopants can include phosphorus (P), arsenic (As), antimony (Sb) or a combination thereof.

The substrate includes isolation regions (not shown) to isolate active device regions from other active device regions, as required. The isolation regions, for example, are shallow trench isolation (STI) regions. Other types of isolation regions are also useful. For example, isolation regions may be used to isolate rows and columns of memory cells.

A memory cell includes a cell transistor with a gate 320 between first and second cell terminals 322 and 324. The gate, in one embodiment, is a split gate. For example, the split gate includes primary and secondary gates 330 and 340. The primary gate, for example, is a storage gate. The storage gate includes a control gate 338 and a floating gate 334. The gates, for example, are polysilicon gates. The gates may be formed by, for example, chemical vapor deposition (CVD). Other suitable types of gates or forming techniques may also be useful. The floating gate is separated from the substrate by a floating gate dielectric 332 and the control gate is separated from the floating gate by a storage gate dielectric 336. The floating gate dielectric, in one embodiment, is a thermal oxide. As for the storage gate dielectric, it is an oxide/nitride/oxide (ONO) stack. The ONO stack may be formed by, for example, CVD. Other suitable types of floating gate or storage gate dielectrics as well as forming techniques may also be useful.

In one embodiment, the storage gate includes a hard mask layer 339 over it. For example, the hard mask is disposed over the control gate. The hard mask, for example, is silicon oxide. The hard mask, for example, may be formed by CVD. Other suitable types of hard mask or dielectric materials and forming techniques may also be useful.

As for the secondary gate, it serves as an access gate. The secondary gate is disposed adjacent to the storage gate and first cell terminal. The secondary gate includes an access gate separated from the substrate by an access gate dielectric 342.

The access gate, for example, may be polysilicon. The access gate may be formed by CVD. Other suitable types of access gates or forming techniques may also be useful. The access gate dielectric may be thermal oxide. For example, the access gate dielectric and floating gate dielectric may be formed of the same thermal oxide layer. Other suitable configurations of the access gate may also be useful. The storage gate and access gate may be gate conductors. For example, the gates form common gates for a row of memory cells.

The source/drain (S/D) regions 322 and 324 are heavily doped first polarity type doped regions. For example, first polarity type doped S/D regions are for first polarity type cell transistors. In one embodiment, the first polarity type is n-type for a n-type cell transistor. Providing p-type S/D regions may also be useful for p-type cell transistors. In one embodiment, the second S/D region 324 serves as a source line of the memory cell. The second S/D region, for example, is a common S/D region for a row of memory cells.

An erase gate 350 is disposed over the second S/D region. The erase gate, for example, is a polysilicon gate formed by CVD. Other suitable types of gate materials or forming techniques may also be useful. The erase gate is isolated from the second S/D region by an erase gate dielectric 370. The erase gate dielectric, for example, is a thermal oxide layer. Other suitable dielectric materials may also be used as the erase gate dielectric. The thickness of the erase gate dielectric should be sufficient to electrically isolate the erase gate from the second S/D region.

Dielectric spacers may be provided on sidewalls of the gates. The spacers provide electrical separation from the gates and serve to facilitate forming LDD and halo regions (not shown) in the S/D regions. The spacers may be spacer stacks having multiple dielectric layers. In one embodiment, sidewalls of the storage gate are lined with oxide and nitride layers 362 and 364. The oxide layer may be a high temperature oxide (HTO) formed by CVD followed by an anneal while the nitride liner is formed by CVD. To form these spacers, the oxide and nitride layers may be formed and anisotropically etched, leaving spacers on the sidewalls. A HTO spacer 366 is disposed on the nitride spacer on the access gate side of the control gate and a HTO spacer 367 is disposed on the nitride spacer on the erase gate side of the control gate. As for the spacer 369 on sidewall of the access gate adjacent to the first cell terminal and spacer 368 on sides of the control gate above the access gate and erase gate, it includes a low temperature oxide (LTO) and nitride. The spacers, for example, are formed using spacer techniques, such as anisotropically etching the layers to remove horizontal portions while vertical portions of the layers remain as the spacers. Other suitable configurations of spacers may also be useful.

The cell transistors of the memory cell pair share a common second S/D region. Likewise, the cell transistors of the memory cell pair share a common erase gate. An EGL is coupled to the erase gate and a SL is coupled to the second S/D region. A first wordline (WL$_1$) is coupled to the access gate of the first cell transistor and a first control gate line (CGL$_1$) is coupled to the control gate of the first cell transistor; a second wordline (WL$_2$) is coupled to the access gate of the second cell transistor and a second control gate line (CGL$_2$) is coupled to the control gate of the second cell transistor. As for the first terminals of the cell transistors, they are coupled to a common bitline (BL). For example, the cells of the memory cell pair are part of the same column of memory cells. Memory cells may be interconnected by WLs, CGLs, EGLs, SLs and BLs to form a memory array.

A dielectric layer (not shown) is disposed over the memory cell. The dielectric layer, for example, serves as a contact level of an interlevel dielectric (ILD) layer. For example, the dielectric layer serves as a contact level of the first ILD level or layer. Contacts are formed to the various terminals of the memory cell. For example, contacts are coupled to the first and second S/D regions, control gates and access gates of the memory cell. Conductive lines may be provided in a metal level of the ILD layer. For example, conductive lines may be provided in the first metal level of the first ILD layer. Additional ILD layers with contact and metal levels are provided.

Lines disposed in the same direction may be provided in the same metal level. Different direction lines are provided in different metal levels. For example, in the case where CGLs, WLs, SLs and EGLs are disposed in a first direction, they may be disposed in the same metal level, such as the first metal level (M1) while BLs which are disposed in a second direction, may be provided in a different metal level, such as the second metal level (M2). Other suitable configurations of conductive lines may also be useful.

Figure 4:
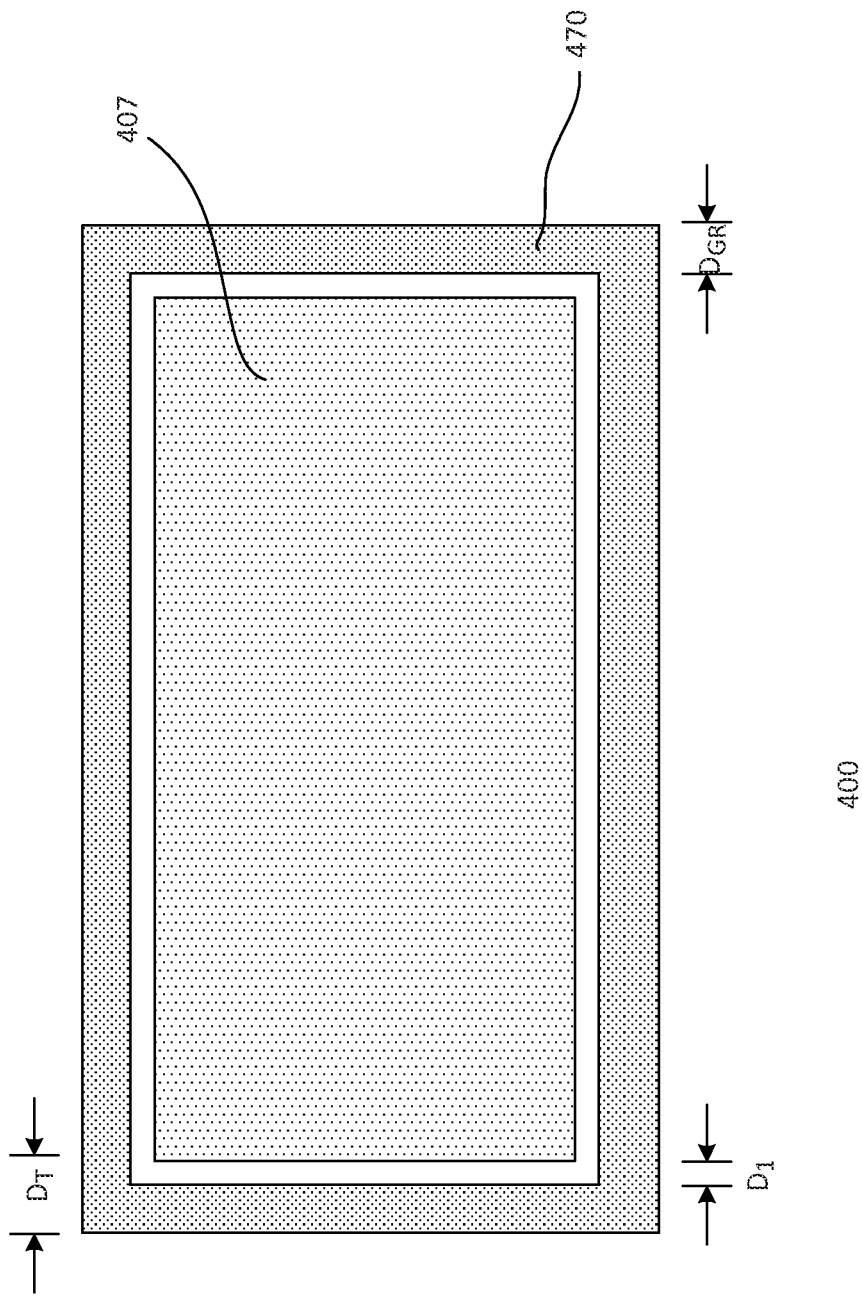
FIG. 4 shows a layout of a memory array of a device.

FIG. 4 shows a simplified layout of an embodiment of a device 400. As shown, the device includes an array region 407 in which memory cells are disposed. As described, the device may include other device regions, such as logic regions, including HV, MV and LV regions (not shown). The memory cells, for example, are NVM cells, as described in FIGS. 1-3. Common elements may not be described or described in detail. For example, a memory cell includes a storage gate and access gate between first and second cell terminals. The storage gate includes a control gate disposed over a floating gate separated by a storage gate dielectric. Other suitable types of memory cells may also be useful.

In one embodiment, a guard ring 470 surrounds the array region. As shown, the guard ring is displaced from the array region by a distance $D_1$. The distance in which the guard ring is displaced should be sufficient to avoid affecting functions of the memory array. The guard ring, for example, may include a rectangular frame shape as shown in FIG. 4. Other suitable shapes may also be useful. The width of the guard ring $D_{GR}$ should be sufficient to prevent reduction of the height of the storage gate of the memory cells from processing. The width of the guard ring, for example, may be about 20 μm. As shown in FIG. 4, the width of the guard ring, for example, is uniform throughout all four sides of the guard ring. It is understood that the width of the guard ring may not be uniform throughout all four sides of the guard ring. The longer sides of the guard ring, for example, may have a width dimension which is narrower than the shorter sides of the guard ring. For example, the longer sides of the guard ring may have a width dimension of about 10 μm while the shorter sides of the guard ring may have a width dimension of about 20 μm. Other suitable width dimensions and configurations for the guard ring may also be useful. The total distance $D_T$ which the guard ring adds to array size is equal to $D_1+D_{GR}$.

In one embodiment, the guard ring is a storage gate guard ring. For example, the storage gate guard ring includes the same layers as the storage gate. The storage gate guard ring can be formed by patterning the storage gate layers to form both the storage guard ring and storage gates of the memory cells. Other suitable types of guard rings may also be useful.

Figure 5:
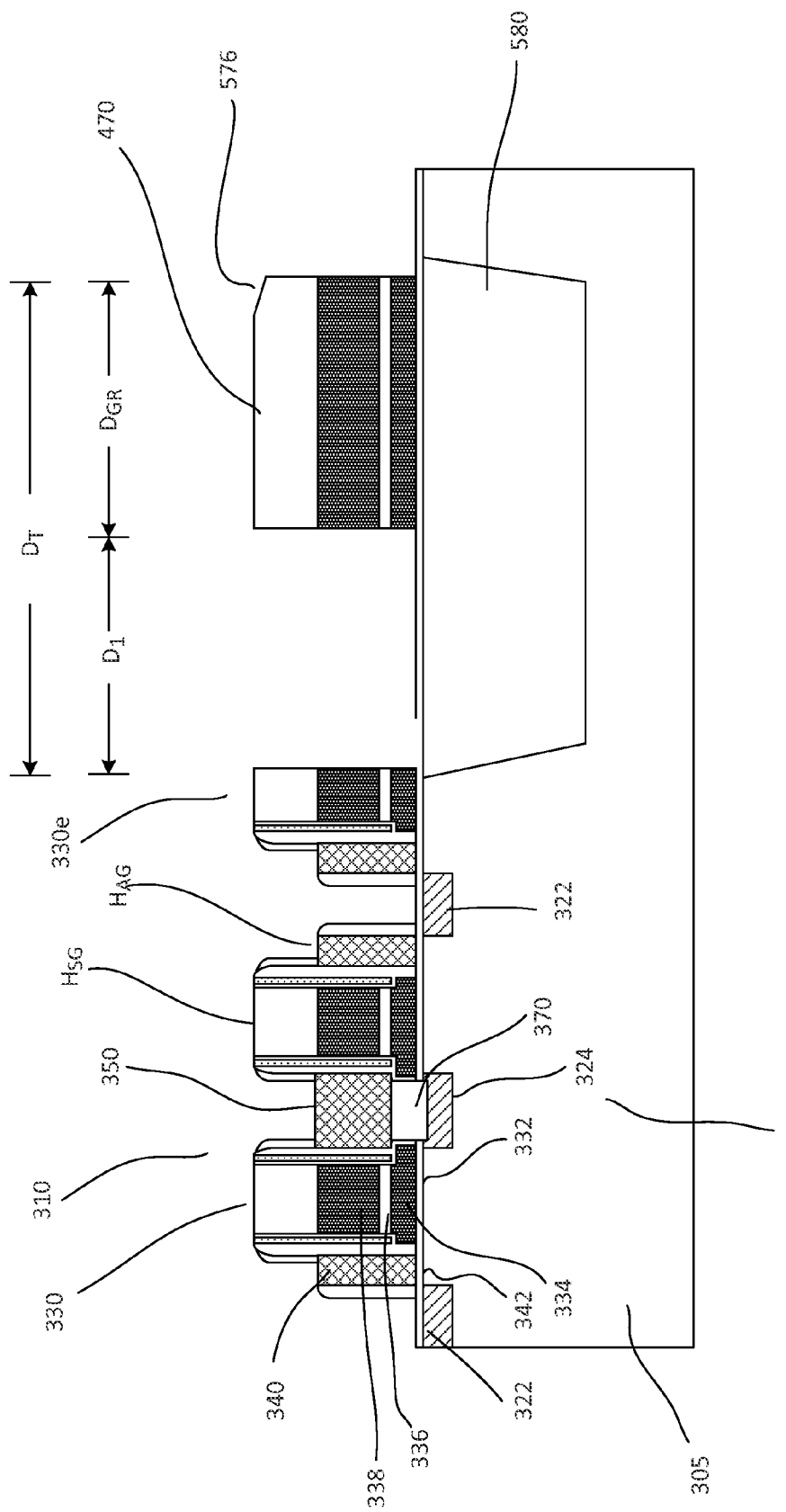
FIG. 5 shows a simplified cross-sectional view of an embodiment of a device.

FIG. 5 shows a simplified cross-sectional view of an embodiment of a device 500. The device includes a substrate 305 with an array region 407. The device, for example, is similar to that described in FIGS. 1-4. Common elements may not be described or described in detail. As discussed, the device may include other device regions, such as logic regions, including HV, MV and LV regions (not shown). The array region includes memory cells 310, such as NVM cells. For example, a memory cell includes a storage gate 330 and an access gate 340 between first and second cell terminals 322 and 324. The storage gate includes a control gate 338 disposed over a floating gate 334 separated by a storage gate dielectric 336. Other suitable types of memory cells may also be useful.

A portion of the array region is shown in FIG. 5. As shown is an edge portion of the array region. For example, the edge may be a first or last row of memory cells. For illustration purpose, the edge portion of the array region includes a memory cell pair which is the same as that described in FIG. 3 and an end gate 330e which may serve as a dummy or non-functional gate. Disposed outside of the array region is a guard ring 470. The guard ring surrounds the array region. The guard ring, for example, may be disposed over an isolation region 580. As shown, the guard ring is displaced from the array region by a distance $D_1$. The distance in which the guard ring is displaced should be sufficient to avoid affecting functions of the memory array. The width of the guard ring $D_{GR}$ should be sufficient to prevent reduction or erosion of the height of the storage gate of the memory cells from processing. The width of the guard ring, for example, may be about 20 µm. Other suitable width dimensions may also be useful. The total distance $D_T$ which the guard ring adds to array size is equal to $D_1+D_{GR}$.

As shown, erosion 576 may occur in the guard ring. However, the erosion does not affect a height $H_{SG}$ of the storage gate in the array region. For example, the height $H_{SG}$ of the storage gate of the memory cell and the dummy gate are not affected. By controlling $H_{SG}$, a height $H_{AG}$ of the access gate is also controlled. This improves access gate thickness uniformity, improving manufacturability and yields.

Figure 6:
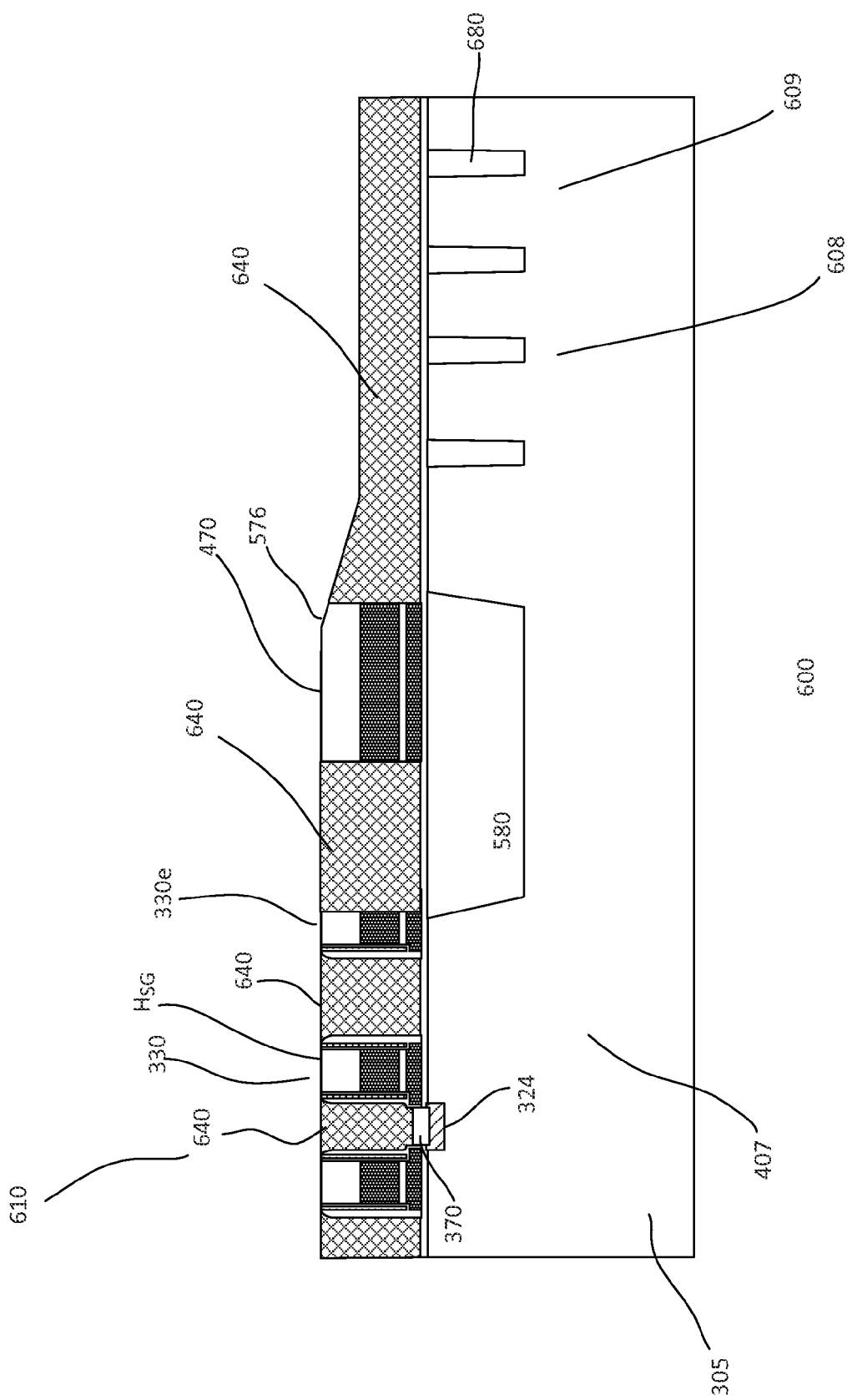
FIG. 6 shows a simplified cross-sectional view of an embodiment a device at an intermediate stage of processing.

FIG. 6 shows a simplified cross-sectional view of an embodiment of a device 600. The device includes a substrate 305 with an array region 407. The device, for example, is similar to that described in FIGS. 1-5. Common elements may not be described or described in detail. As discussed, the device may include other device regions, such as logic regions, including HV and LV regions 608 and 609. The various regions include device wells for respective devices. For example, array region includes an array well while HV regions include HV p wells for HV n-type devices and HV n wells for HV p-type devices and LV regions include LV p wells for LV n-type devices and LV n wells for LV p-type devices. The various regions may be isolated by isolation regions 680.

The device shown is at an intermediate stage of processing. For example, the substrate has been partially processed to include partial memory cells 610. As shown, the substrate has been processed to include storage gates 330 with sidewall spacers, second S/D regions 324 and erase gate dielectrics 370. A gate electrode layer 640 is deposited on the substrate, filling the gaps between and covering the control gates in the array region and guard ring. The gate electrode layer also covers the logic regions, including the HV and LV regions. The gate electrode layer, for example, is a polysilicon layer formed by CVD. Other suitable gate electrode materials and forming techniques may also be useful.

A planarization process, such as a chemical mechanical polishing (CMP) is performed. As shown, the CMP produces a planar surface with the gate electrode layer, storage gates and guard ring. The top surface of the gate electrode layer in the logic regions is planar but has a height lower than that in the array region. However, the guard ring maintains planarity of the gate electrode layer in the array region. This improves access gate thickness uniformity, improving manufacturability and yields.

Figure 7:
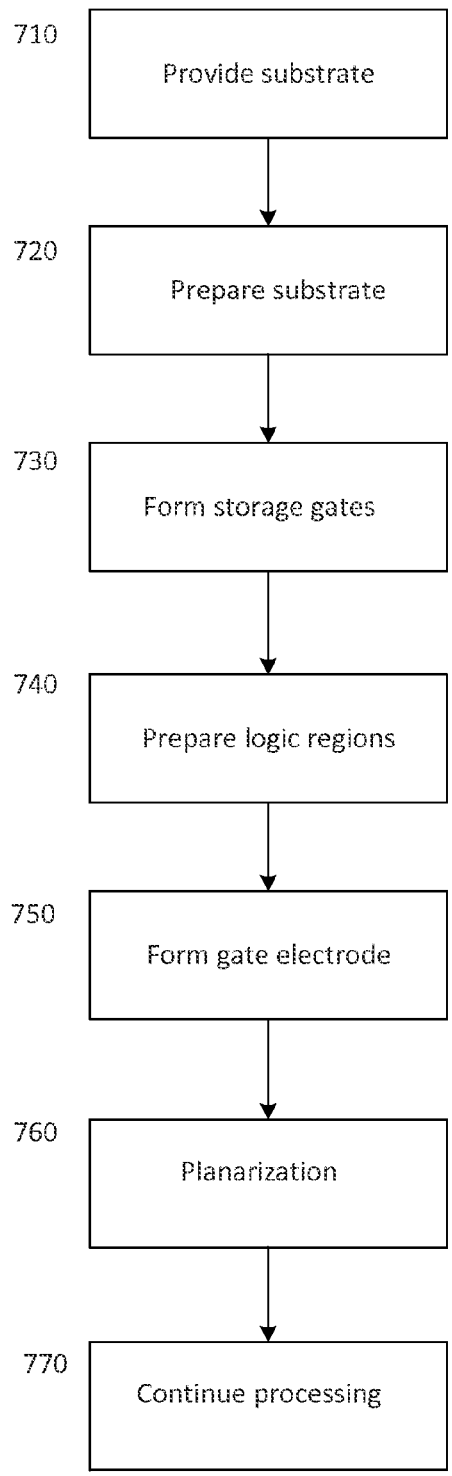
FIG. 7 shows a simplified process flow for forming an embodiment of a device.

FIG. 7 shows a simplified embodiment of a process flow 700 for forming a device. In step 710, a substrate is provided. Initial front end of line (FEOL) processing is performed on the substrate at step 720. For example, the substrate is prepared with isolation regions defining active regions of the device. For example, exposed portions of the substrate not filled with isolation regions serve as active regions of the device. The active regions, for example, include array, HV and LV regions. Other regions may also be included.

After forming the isolation regions, wells are formed in the substrate. For example, doped wells are formed in the array, HV and LV regions. The wells may be performed by ion implantation using implant masks, such as photoresist. Different wells are formed using different implant processes.

At step 730, storage gates are formed in the array region of the substrate. For example, various layers of the storage gates are formed on the substrate. This, for example, include forming a tunneling gate dielectric layer, a floating gate electrode layer, a storage dielectric layer, a control gate electrode layer, and a hard mask layer. The layers are patterned to form storage gate conductors as well as a guard ring surrounding the array region. Dielectric spacers are formed on the sidewalls of the control gate conductors.

The process continues to process the logic regions at step 740. For example, the process forms gate dielectric layers for the logic regions, such as the HV and LV regions. Separate processes, for example, may be used to form the different gate dielectric layers. A gate electrode layer is formed over the substrate at step 750. The gate electrode layer fills the gaps and covers the storage gates in the array region and guard ring and gate dielectric layers in the HV and LV regions. The gate electrode layer, for example, is suitable for forming access gates or word lines and erase gates for the memory cells disposed over the array region and for forming gates of various transistors over the logic region.

Excess gate electrode materials are removed by a planarization process, such as CMP at step 760. As discussed, the guard ring maintains the thickness of the gate electrode layer in the array region such that the thickness is uniform. For example, the gate electrode layer has a top surface which is coplanar with the top of the storage gates. The top surface of the gate electrode layer is lower in the logic regions than in the array region.

The process continues to complete the formation of the memory cells and transistors of the logic regions at step 770. For example, the gate electrode layer is recessed to a desired height to form the access gate. After recessing, the gate electrode layer is patterned to form the access gates and gates of transistors in the logic regions. Source/drain regions of transistors and memory cells are formed after forming the gates. This may include forming spacers to facilitate forming LDD and halo regions. The process continues with back end of line (BEOL) processing to form interconnects and passivation. After BEOL is completed, the wafer is diced into individual chips, assembled and tested. Other processes may also be included.

The embodiments as described include several advantages. For example, the guard ring which is disposed and provided adjacent to the edge of the array region protects at least the gate electrode layer at the edge region of the array region from being removed during the CMP process. As a result, the thickness of the remaining gate electrode layer after the CMP process is uniform and substantially coplanar with the storage gate across the center and edge regions of the array region, improving manufacturability and yields. As the remaining gate electrode layer at the edge region of the array region is not eroded, the remaining gate electrode layer is sufficiently thick to allow for, for example, reactive ion etch process to properly define and form the access gates later. In addition, the remaining gate electrode layer is also sufficiently thick to prevent penetration of gate electrode dopants, such as nitrogen, into the substrate. This prevents low threshold voltage for the word line and avoids degradation of the memory cell performance. Furthermore, less BL and WL dummy structures at the edge of the array region is required in view of the presence of the guard ring.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a substrate having an array region in which memory cells are to be formed;
   forming storage gates of the memory cells in the array region, wherein each of the storage gates comprises a floating gate and a control gate formed over the floating gate;
   forming a guard ring surrounding the array region;
   forming a gate electrode layer on the substrate, wherein the gate electrode layer fills gaps between the storage gates having the floating and control gates and guard ring as well as covering at least the control gates of the storage gates; and
   planarizing the gate electrode layer to produce a planar surface between the gate electrode layer, storage gates and guard ring, wherein the guard ring maintains thickness of the gate electrode layer in the array region such that thickness of the storage gates across center and edge regions of the array region is uniform.

2. The method of claim 1 wherein the guard ring is a storage gate guard ring which includes the same gate and dielectric layers as the storage gates of the memory cells.

3. The method of claim 1 wherein the guard ring is displaced away from the edge regions of the array region.

4. The method of claim 1 wherein the guard ring comprises a width which is uniform throughout all four sides of the guard ring.

5. The method of claim 1 wherein the guard ring comprises a width which is not uniform throughout all four sides of the guard ring.

6. The method of claim 5 wherein longer sides of the guard ring comprise a width dimension which is narrower than shorter sides of the guard ring.

7. The method of claim 1 wherein forming the storage gates comprises:
   forming a floating gate dielectric layer on the substrate;
   forming a floating gate electrode layer on the floating gate dielectric layer;
   forming a control gate electrode layer; and
   forming a storage dielectric layer in between the floating and control gate electrode layers.

8. The method of claim 7 comprising patterning the floating gate and storage dielectric layers as well as the floating and control gate electrode layers to simultaneously form the storage gates and the guard ring.

9. The method of claim 1 comprising:
   forming first and second memory cell terminals adjacent to first and second sides of the storage gates, wherein the second memory cell terminals of adjacent storage gates form a common second cell terminal; and
   wherein the gate electrode layer is recessed to a desired height to form at least access gates of the memory cells adjacent to the first memory cell terminals of the storage gates.

10. The method of claim 1 comprising:
    forming first and second memory cell terminals adjacent to first and second sides of the storage gates, wherein the second memory cell terminals of adjacent storage gates form a common second cell terminal; and
    wherein the gate electrode layer is recessed to a desired height to form access gates adjacent to the first memory cell terminals and erase gates over the common second cell terminals of the memory cells.

11. A method for forming a device comprising:
    providing a substrate having an array region in which memory cells are to be formed;
    forming storage gates of the memory cells in the array region, wherein each of the storage gates comprises a floating gate and a control gate formed over the floating gate and a storage dielectric layer formed in between the floating and control gates;
    forming a guard ring surrounding the array region, wherein the guard ring is a storage gate guard ring which includes the same layers as the storage gates of the memory cells; and
    forming a gate electrode layer on the substrate, wherein the gate electrode layer fills gaps between the storage gates having the floating and control gates and guard ring as well as covering at least the control gates of the storage gates.

12. The method of claim 11 wherein the guard ring comprises a height which is the same as height of the storage gates of the memory cells.

13. The method of claim 11 wherein forming the storage gates comprises:
    forming a floating gate dielectric layer on the substrate;
    forming a floating gate electrode layer on the floating gate dielectric layer;
    forming a control gate electrode layer; and
    forming a storage dielectric layer in between the floating and control gate electrode layers.

14. The method of claim 13 comprising patterning the floating gate and storage dielectric layers as well as the floating and control gate electrode layers to simultaneously form the storage gates and the guard ring.

15. The method of claim 11 comprising:
    planarizing the gate electrode layer to produce a planar surface between the gate electrode layer, storage gates and guard ring, wherein the guard ring protects the gate electrode layer at edge region of the array region from being removed during planarizing the gate electrode layer.

16. The method of claim 15 comprising recessing the planarized gate electrode layer to a desired height to form access gates of the memory cells.

17. The method of claim 16 wherein the height of the access gates is controlled by controlling the height of the storage gates.

18. The method of claim 15 comprising recessing the planarized gate electrode layer to a desired height to form access gates and erase gates of the memory cells.

19. A method for forming a device comprising:
providing a substrate having an array region in which memory cells are to be formed and a logic region in which logic devices are to be formed;
forming storage gates of the memory cells in the array region, wherein each of the storage gates comprises a floating gate and a control gate formed over the floating gate and a storage dielectric layer formed in between the floating and control gates;
forming a guard ring surrounding the array region, wherein the guard ring is a storage gate guard ring which includes the same layers as the storage gates of the memory cells; and
forming a gate electrode layer on the substrate, wherein the gate electrode layer fills gaps between the storage gates having the floating and control gates and guard ring as well as covering at least the control gates of the storage gates and over the logic region.

20. The method of claim 19 comprising:
planarizing the gate electrode layer to produce a planar surface between the gate electrode layer, storage gates and guard ring in the array region and to produce a planar surface of the gate electrode layer in the logic region, wherein the guard ring protects the gate electrode layer at edge region of the array region from being removed during planarizing the gate electrode layer, and wherein the gate electrode layer in the logic region comprises a height which is lower than height of the gate electrode layer in the array region.

* * * * *